(12) United States Patent
Brisbin et al.

(10) Patent No.: US 7,718,448 B1
(45) Date of Patent: May 18, 2010

(54) METHOD OF MONITORING PROCESS MISALIGNMENT TO REDUCE ASYMMETRIC DEVICE OPERATION AND IMPROVE THE ELECTRICAL AND HOT CARRIER PERFORMANCE OF LDMOS TRANSISTOR ARRAYS

(75) Inventors: Douglas Brisbin, San Jose, CA (US); Prasad Chaparala, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1391 days.

(21) Appl. No.: 11/139,819

(22) Filed: May 27, 2005

(51) Int. Cl.
 *G01R 31/26* (2006.01)
 *G06F 17/18* (2006.01)
 *G06F 17/50* (2006.01)

(52) U.S. Cl. .................. 438/18; 438/14; 438/17; 257/204; 257/208; 257/365; 324/765; 324/158.1; 702/179; 702/180; 702/181; 716/4; 716/5

(58) Field of Classification Search ............ 438/14, 438/17, 18, 213; 257/204, 208, 365; 324/765, 324/158.1; 702/179–181; 716/4–5
See application file for complete search history.

(56) References Cited

U.S. PATENT DOCUMENTS

| 5,517,046 | A  | * | 5/1996  | Hsing et al. ............. 257/336 |
| 5,600,578 | A  | * | 2/1997  | Fang et al. .............. 703/14  |
| 6,461,880 | B1 | * | 10/2002 | Tsiang .................. 438/14  |
| 6,563,320 | B1 | * | 5/2003  | Look et al. .............. 324/512 |
| 6,921,946 | B2 | * | 7/2005  | Tao et al. ............... 257/355 |

* cited by examiner

*Primary Examiner*—Ha Tran T Nguyen
*Assistant Examiner*—Karen M Kusumakar
(74) *Attorney, Agent, or Firm*—Mark C. Pickering

(57) ABSTRACT

A number of modified lateral DMOS (LDMOS) transistor arrays are formed and tested to determine if a measured value, such as a series on-resistance, substrate current, breakdown voltage, and reliability, satisfies process alignment requirements. The modified LDMOS transistor arrays are similar to standard LDMOS transistor arrays such that the results of the modified LDMOS transistor arrays can be used to predict the results of the standard LDMOS transistor arrays.

20 Claims, 7 Drawing Sheets

METHOD OF MONITORING PROCESS MISALIGNMENT TO REDUCE ASYMMETRIC DEVICE OPERATION AND IMPROVE THE ELECTRICAL AND HOT CARRIER PERFORMANCE OF LDMOS TRANSISTOR ARRAYS

BACKGROUND OF THE INVENTION

1. Field of the Invention

The present invention relates to LDMOS transistor arrays and, more particularly, to a method of monitoring mask misalignment biases of key LDMOS process steps. By characterizing these offsets, process biases can be eliminated, leading to improved electrical and hot carrier reliability performance of LDMOS arrays.

2. Description of the Related Art

A lateral DMOS (LDMOS) transistor array is a well known semiconductor structure that is commonly used in high power applications. FIGS. 1A-1B show views that illustrate a prior-art, dual-device LDMOS transistor array 100. FIG. 1A shows a plan view, while FIG. 1B shows a cross-sectional view taken along lines 1B-1B of FIG. 1A.

As shown in FIGS. 1A and 1B, array 100 includes a p– semiconductor material 110, such as an epitaxial layer or a substrate, and spaced-apart first and second n+ source strips 112 and 114 that are formed in material 110. Further, array 100 includes an n– drain extension region 116, such as a well, that is formed in p– semiconductor material 110 between source strips 112 and 114, and an n+drain strip 118 that is formed in n– drain extension region 116.

In addition, array 100 includes a first channel strip 120 that lies between n+ source strip 112 and n– drain extension region 116, and a second channel strip 122 that lies between n+ source strip 114 and n– drain extension region 116. Array 100 also includes a first oxide strip 124 that is formed on first channel strip 120, a second oxide strip 126 that is formed on second channel strip 122, and a field oxide region FOX that is formed in p– semiconductor material 110 and n– drain extension region 116.

As further shown in FIGS. 1A-1B, array 100 includes a first gate 130 that is formed on first oxide strip 124 over first channel strip 120, and a second gate 132 that is formed on second oxide strip 126 over second channel strip 122. In addition, a single line 134 is electrically connected to both of the gates 130 and 132 via contacts 130C and 132C, and a bond pad 136 is electrically connected to single line 134.

In operation, n+ source strip 112, n– drain extension region 116, n+drain strip 118, and gate 130 are the elements of a first MOS device 140, while n+ source strip 114, n– drain extension region 116, n+drain strip 118, and gate 132 are the elements of a second MOS device 142. First MOS device 140 and second MOS device 142 operate in a conventional fashion, and respond to the same voltage on bond pad 136.

When used in a high power application, strong electric fields are present. The strong electric fields accelerate charge carriers in the channel strips into having ionizing collisions with the lattice which, in turn, leads to the formation of hot carriers. Hot carriers, however, degrade a number of device parameters over time.

For example, the series on-resistance and the substrate current degrade (increase) with time as a result of hot carrier damage. Degradation in the series on-resistance and substrate current leads to increased device series resistance and heat dissipation, eventually leading to device failure. The n-channel LDMOS (NLDMOS) transistor is particularly prone to early failure due to increased series on-resistance and substrate current resulting from hot carrier damage.

One condition which can greatly influence the operation of MOS devices 140 and 142 is the misalignment of n– drain extension region 116. As shown in FIG. 1B, n– drain extension region 116 is centered with respect to n+drain region 118. However, process misalignment biases that occur during the manufacturing process can cause n– drain extension region 116 to be shifted either right or left which, in turn, leads to asymmetric device operation.

This asymmetric device operation adversely impacts electrical device parameters, such as breakdown voltage, on-resistance, substrate current and device hot carrier reliability. Thus, there is a need for a method of monitoring these process biases so that they can be eliminated, resulting in LDMOS devices with more symmetrical electrical operation and hot carrier reliability.

BRIEF DESCRIPTION OF THE DRAWINGS

FIG. 1A is a plan view. FIG. 1B is a cross-sectional view taken along lines 1B-1B of FIG. 1A.

FIG. 3A is a plan view. FIG. 3B is a cross-sectional view taken along lines 3B-3B of FIG. 3A.

DETAILED DESCRIPTION OF THE INVENTION

Figure 2:
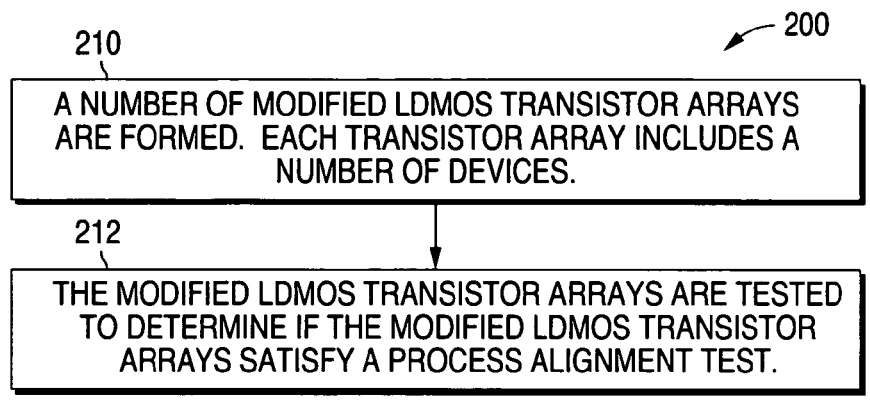
FIG. 2 is a flow chart illustrating an example of a method 200 of testing lateral DMOS (LDMOS) transistor arrays in accordance with the present invention.

FIG. 2 shows a flow chart that illustrates an example of a method 200 of testing lateral DMOS (LDMOS) transistor arrays in accordance with the present invention. As described in greater detail below, the present invention measures the substrate currents, series on-resistances, breakdown voltages and hot carrier performance of the devices in a LDMOS transistor array.

Device misalignment biases result in undesired asymmetric electrical operation and reliability between the devices in the LDMOS array. The present invention measures these asymmetries and utilizes the electrical measurements to quantify and provide information on effective process misalignment so that manufacturing process biases can be minimized to acceptable values. Minimizing these alignment biases improves electrical performance (especially breakdown voltage) and device reliability.

As shown in FIG. 2, method 200 begins at 210 where a number of modified LDMOS transistor arrays are formed. Each LDMOS transistor array, in turn, includes a number of devices. For example, 600 modified LDMOS transistor arrays can be formed, where each LDMOS array includes two devices. The modified LDMOS transistor arrays can be fabricated using the same implant steps and nearly the same device processing steps that are used to form standard LDMOS transistor arrays.

A modified LDMOS transistor array differs from a standard LDMOS transistor array only in the gate connections, with the gates in the modified LDMOS transistor array each being connected to a separate bond pad. The separate gate connections allow each device to be monitored separately.

Figure 1A:
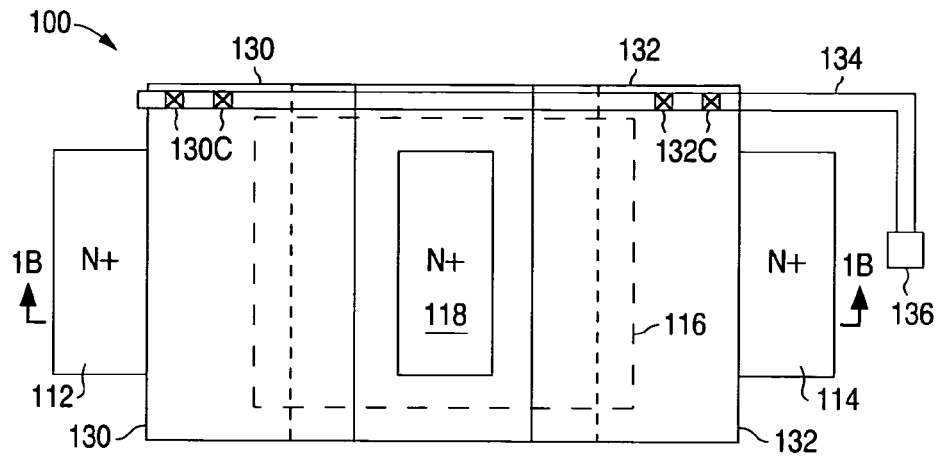
FIGS. 1A-1B are views illustrating a prior-art, dual-device LDMOS transistor array 100.
Figure 1B:
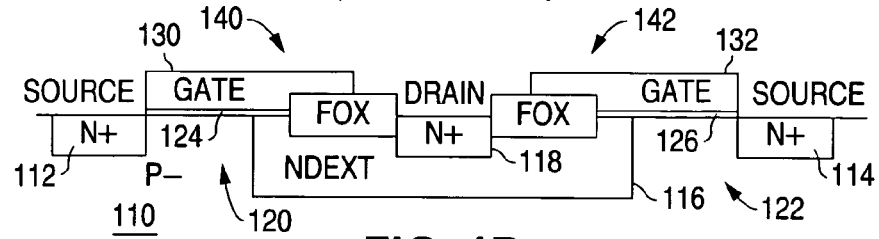
Figure 3A:
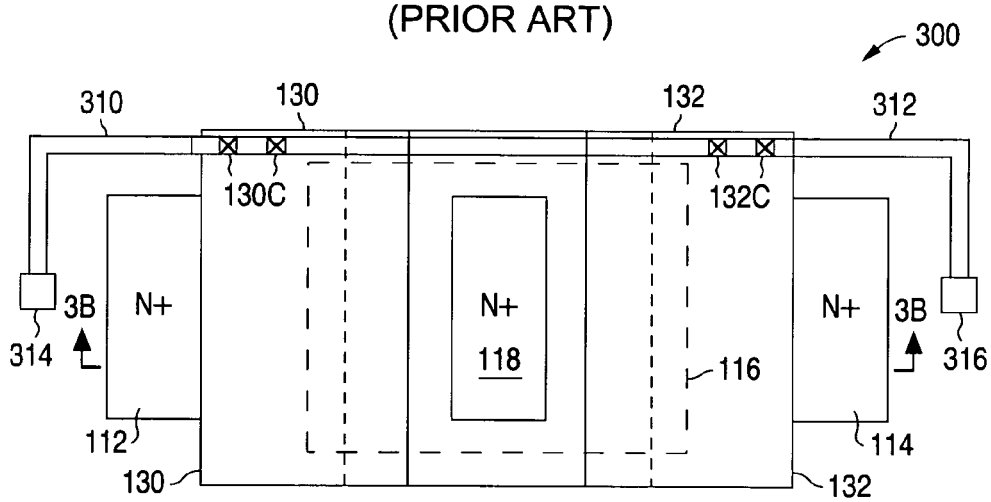
FIGS. 3A-3B are views illustrating an example of a modified dual-device LDMOS transistor array 300 in accordance with the present invention.
Figure 3B:
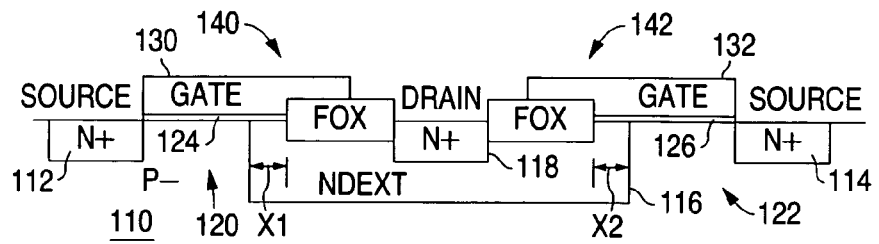

FIGS. 3A-3B show views that illustrate an example of a modified dual-device LDMOS transistor array 300 in accordance with the present invention. Array 300 is similar to array 100 and, as a result, utilizes the same reference numerals to designate the structures which are common to both arrays. (Although array 300 is illustrated as a dual device array, any number of devices can alternately be included in the array.)

As shown in FIGS. 3A-3B, array 300 differs from array 100 in that array 300 includes two lines 310 and 312 that are connected to gates 130 and 132, respectively, via contacts 130C and 132C, respectively, and two bond pads 314 and 316 that are connected to lines 310 and 312, respectively. As a result, gates 130 and 132 are electrically isolated from each other.

Figure 4:
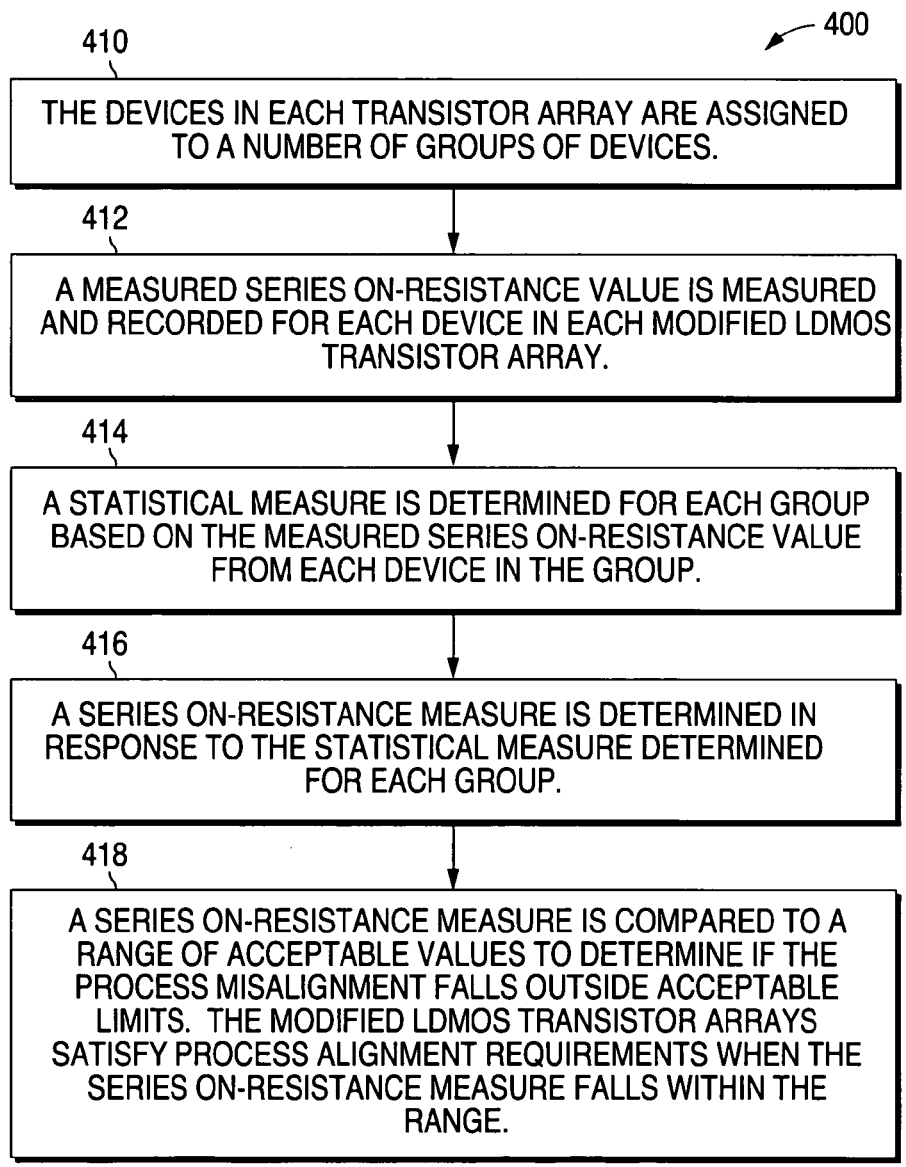
FIG. 4 is a flow chart illustrating an example of a method 400 of determining if the modified LDMOS transistor arrays satisfy a process alignment test in accordance with the present invention.

Returning to FIG. 2, after the modified LDMOS transistor arrays have been formed, at 212, the modified LDMOS transistor arrays are tested to determine if the modified LDMOS transistor arrays satisfy a process alignment test. FIG. 4 shows a flow chart that illustrates an example of a method 400 of determining if the modified LDMOS transistor arrays satisfy a process alignment test in accordance with the present invention. In the FIG. 4 example, the process alignment test is a series on-resistance test.

As shown in FIG. 4, method 400 begins at 410 where the devices in each transistor array are assigned to a number of groups of devices. For example, the first MOS device 140 in each array 300 can be assigned to a first group, while the second MOS device 142 in each array 300 can be assigned to a second group.

Following this, at 412, a measured series on-resistance value is measured and recorded for each device in each modified LDMOS transistor array. For example, if 600 modified LDMOS transistor arrays 300 are formed on a wafer, the measured series on-resistance values for 600 first MOS devices 140 and 600 second MOS devices 142 are measured and recorded.

Once the measured (series on-resistance) values have been determined, method 400 moves to 414. At 414, a statistical measure is determined for each group based on the measured series on-resistance value from each device in the group. For example, an average or mean measured series on-resistance value can be determined for the devices in the first group, such as the 600 MOS devices 140.

In addition, an average or mean measured series on-resistance value can be determined for the devices in the second group, such as the 600 MOS devices 142. Similarly, the average or mean measured series on-resistance value can be determined for the devices in any additional groups when more than two devices are present in an array. (Standard deviations and other measures can also be determined.)

Next, at 416, a series on-resistance measure is determined in response to the statistical measure determined for each group. The series on-resistance measure can be equal to a difference between a largest statistical measure of a group of devices and a smallest statistical measure of a group of devices.

For example, when the statistical measure is an average or mean value, the series on-resistance measure is equal to the difference between the largest average or mean measured series on-resistance value of a group of devices and the smallest average or mean measured series on-resistance value of a group of devices.

In the case of dual-device arrays, such as array 300, the series on-resistance measure is equal to the difference between the average or mean measured series on-resistance value of the MOS devices 140 in the first group and the average or mean measured series on-resistance value of the MOS devices 142 in the second group.

For example, 600 first MOS devices 140 could have an average measured series on-resistance value of 616Ω, while 600 second MOS devices could have an average measured series on-resistance of 628Ω. As a result, the first and second MOS devices 140 and 142 have an average 12Ω difference.

Figure 5:
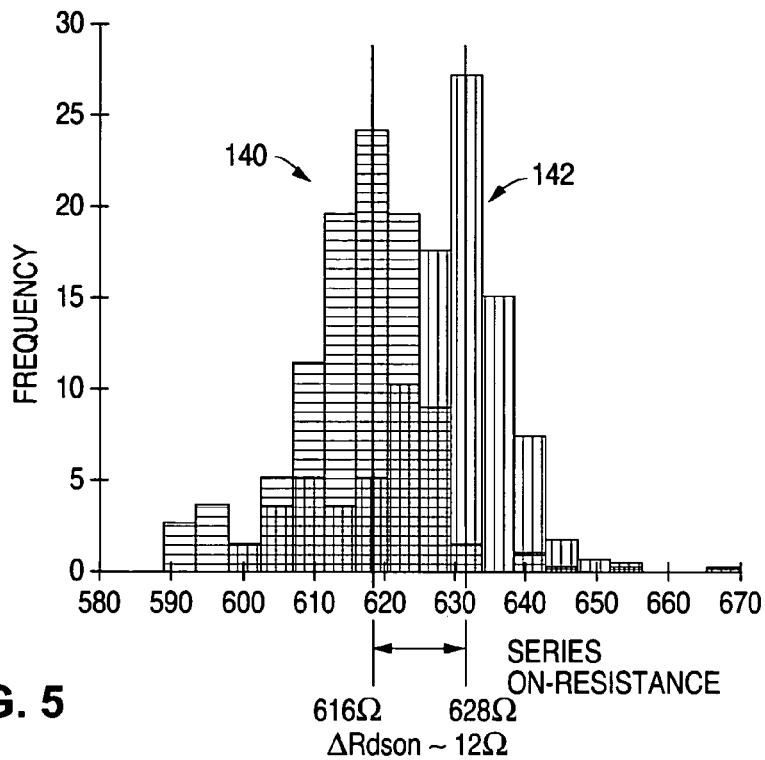
FIG. 5 is a graph illustrating an example of the series on-resistance distributions of the first and second MOS devices 140 and 142 of 600 LDMOS transistor arrays 300 in accordance with the present invention.

FIG. 5 shows a graph that illustrates an example of the series on-resistance distributions of the first and second MOS devices 140 and 142 of 600 LDMOS transistor arrays 300 in accordance with the present invention. As shown in the FIG. 5 example, the 600 MOS devices 140 in the first group have an average measured series on-resistance value of 616Ω, while the 600 MOS devices 142 in the second group have an average measured series on-resistance of 628Ω. As a result, the groups of first and second MOS devices 140 and 142 have an average 12Ω difference.

This on-resistance difference is a measure of the process misalignment bias of the first device 140 relative to the second device 142. If process alignment is perfect, no average on-resistance difference of the first device 140 relative to the second device 142 would be observed.

Returning to FIG. 4, at 418, the series on-resistance difference is compared to a range of acceptable values to determine if the process misalignment falls outside acceptable limits. When the series on-resistance difference is zero or within the range of acceptable values (surrounding zero), the modified LDMOS transistor arrays satisfy process alignment requirements.

When the series on-resistance difference falls outside of the user-defined range of acceptable values, the modified LDMOS transistor arrays fail to satisfy the process alignment requirements. For example, the average difference of 12Ω can be considered to fall outside of the range of acceptable values.

Thus, if the difference between the average value of the series on-resistance of the first devices and the average value of the series on-resistance of the second devices is substantially the same, the LDMOS transistor arrays which are formed with the process have substantially the same series on-resistance values.

The process alignment test can also include tests to measure the substrate currents, breakdown voltages, and reliabilities of the devices in the modified LDMOS transistor arrays. In a similar manner, the MOS devices 140 in the first group have an average measured substrate current, breakdown voltage, and reliability, while the MOS devices 142 in the second group have an average measured substrate current, breakdown voltage, and reliability. Differences in these averages can also be used to identify process misalignment biases.

Figure 6:
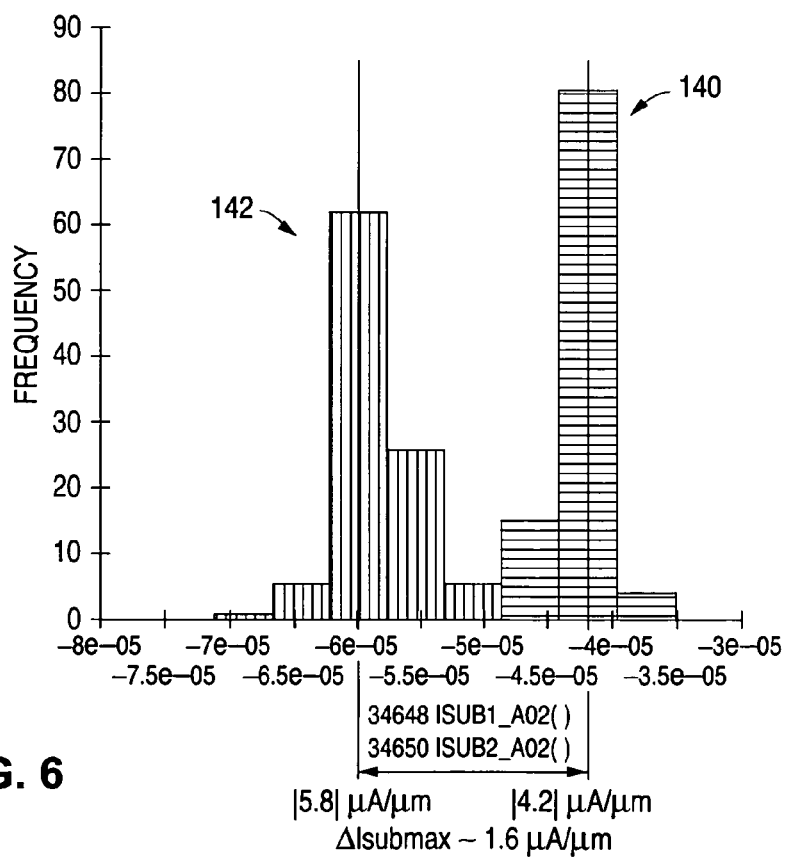
FIG. 6 is a graph illustrating an example of the measured maximum substrate current distributions of the first and second MOS devices 140 and 142 of 600 LDMOS transistor arrays 300 in accordance with the present invention.

FIG. 6 shows a graph that illustrates an example of the measured maximum substrate current distributions of the first and second MOS devices 140 and 142 of 600 LDMOS transistor arrays 300 in accordance with the present invention. As shown in the FIG. 6 example, the 600 MOS devices 140 in the first group have an average measured maximum substrate current value of 4.2 µA/µM, while the 600 MOS devices 142 in the second group have an average measured maximum substrate current of 5.8 µA/µM.

As a result, the groups of first and second MOS devices 140 and 142 have an average 1.6 µA/µM difference. If process alignment is perfect, no difference in the average measured maximum substrate current of the first device 140 relative to the second device 142 would be observed. In this example, the average difference of 1.6 µA/µM can be considered to fall outside of the range of acceptable values.

Figure 7:
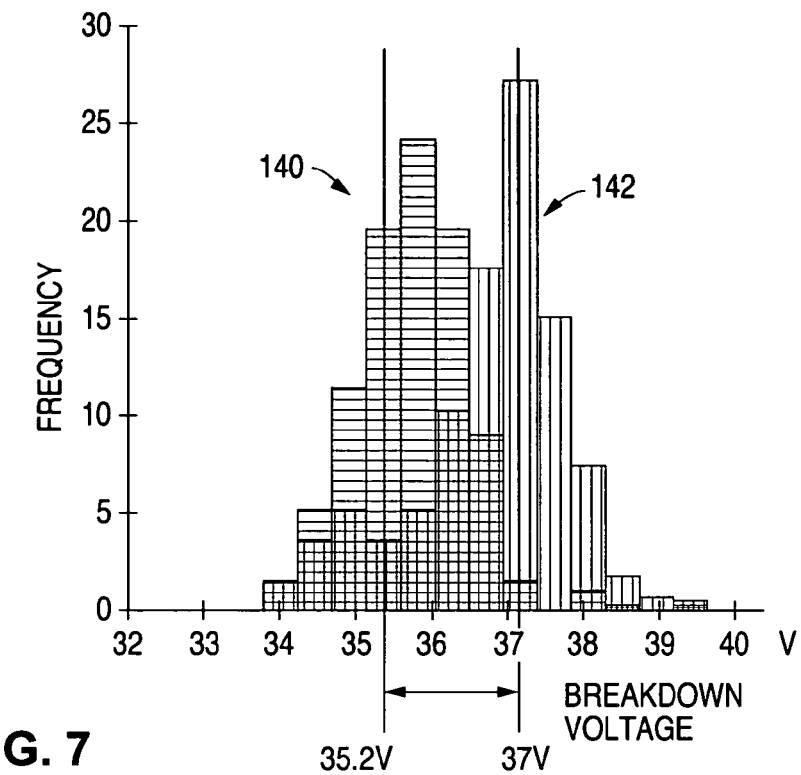
FIG. 7 is a graph illustrating an example of the measured breakdown voltage distributions of the first and second MOS devices 140 and 142 of 600 LDMOS transistor arrays 300 in accordance with the present invention.

FIG. 7 shows a graph that illustrates an example of the measured breakdown voltage distributions of the first and second MOS devices 140 and 142 of 600 LDMOS transistor arrays 300 in accordance with the present invention. As shown in the FIG. 7 example, the 600 MOS devices 140 in the first group have an average measured breakdown voltage of 35.2V, while the 600 MOS devices 142 in the second group have an average measured breakdown voltage of 37V.

As a result, the groups of first and second MOS devices 140 and 142 have an average 1.8V difference. If process alignment is perfect, no difference in the average measured breakdown voltage of the first device 140 relative to the second device 142 would be observed. In this example, the average difference of 1.8V can be considered to fall outside of the range of acceptable values.

Figure 8:
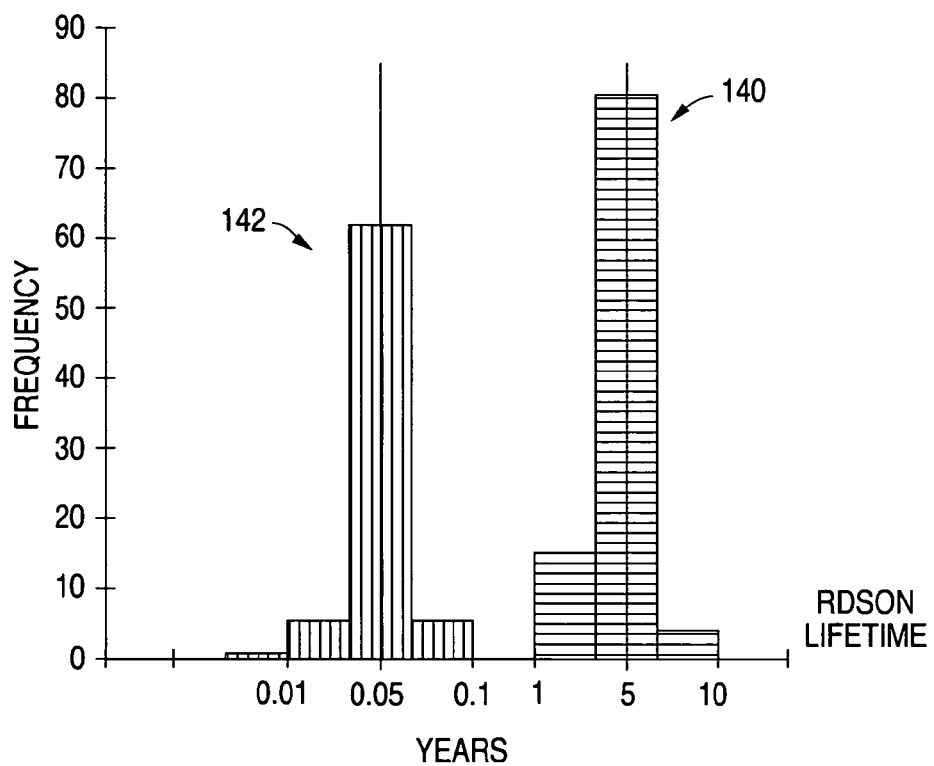
FIG. 8 is a graph illustrating an example of the measured hot carrier on-resistance (Rdson) lifetime distributions of the first and second MOS devices 140 and 142 of 600 LDMOS transistor arrays 300 in accordance with the present invention.

FIG. 8 shows a graph that illustrates an example of the measured hot carrier on-resistance (Rdson) lifetime distributions of the first and second MOS devices 140 and 142 of 600 LDMOS transistor arrays 300 in accordance with the present invention. As shown in the FIG. 8 example, the 600 MOS devices 140 in the first group have an average measured hot carrier lifetime of 5.0 years, while the 600 MOS devices 142 in the second group have an average measured hot carrier lifetime of 0.05 years.

As a result, the groups of first and second MOS devices 140 and 142 have nearly a 5 year difference. If process alignment is perfect, no difference in the average hot carrier lifetime of the first device 140 relative to the second device 142 would be observed. In this example, the average difference of 4.95 years can be considered to fall outside of the range of acceptable values.

The method and the modified LDMOS transistor arrays of the present invention can be utilized when a manufacturing line is set up to ensure that process misalignment biases are minimized. In addition, the modified LDMOS transistor arrays can be incorporated into an integrated circuit to provide power transistor functionality or simply as test devices, and then used during end-of-line testing to ensure that the series on-resistances, breakdown voltages, substrate current and hot carrier reliability are substantially equal (process misalignment biases minimized) in the manufactured parts.

Figure 9:
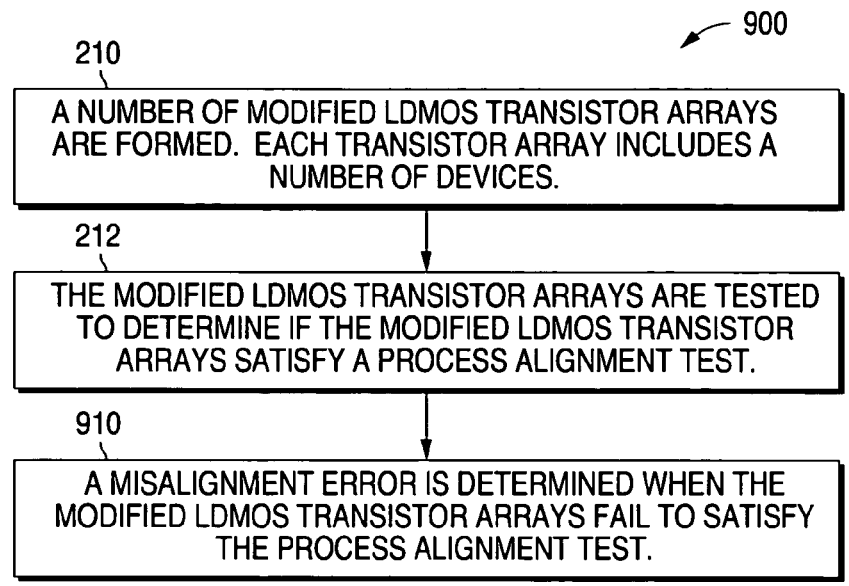
FIG. 9 is a flow chart illustrating an example of a method 900 of identifying a mask alignment error in accordance with the present invention.

FIG. 9 shows a flow chart that illustrates an example of a method 900 of identifying a mask alignment error in accordance with the present invention. Method 900 is similar to method 200 and, as a result, utilizes the same reference numerals to designate the elements which are common to both methods.

Method 900 differs from method 200 in that, at 910, when the results of the process alignment test falls outside of the user-defined range of acceptable values, thereby indicating that the modified LDMOS transistor arrays failed to satisfy the process alignment test, a misalignment error is determined. The mismatch in the average series on-resistances, substrate currents, breakdown voltage, and hot carrier reliability is in large part due to lateral offset that leads to a mask misalignment error during the formation of the n– drain extension region.

Figures 10A, 10B:
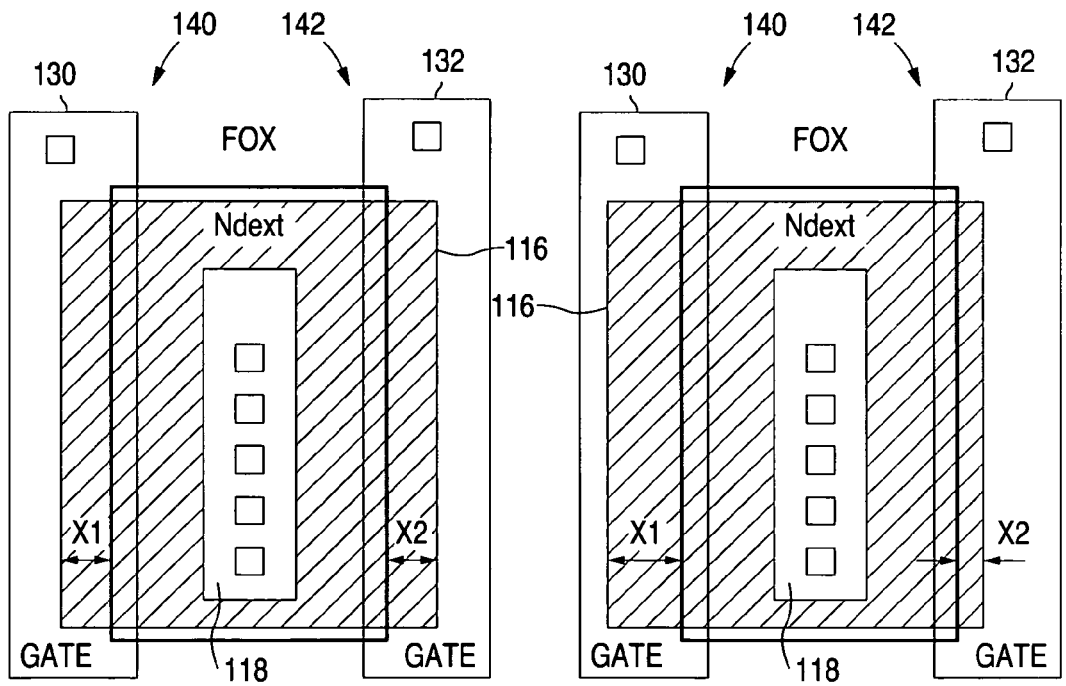
FIGS. 10A and 10B are plan views of array 300 illustrating examples of a lateral offset that leads to a mask misalignment error in accordance with the present invention.

FIGS. 10A and 10B show plan views of array 300 that illustrate examples of a lateral offset that leads to a mask misalignment error in accordance with the present invention. As shown in FIG. 10A, when the lateral offset is zero and the mask alignment is correct, the lateral distances between the edges of n– drain extension region 116 and the edges of the field oxide region FOX, shown as distance X1 and distance X2, are substantially equal for the two devices 140 and 142. When this is the case, the average series on-resistance values, substrate currents, breakdown voltage, and hot carrier reliability are substantially the same for the first and second devices. (FIG. 3B further illustrates equal distances X1 and X2.)

However, as shown in FIG. 10B, when the lateral offsets are different, a mask misalignment error has occurred and the distance X1 is greater than the distance X2. Similarly, a mask misalignment error also occurs when the distance X2 is greater than the distance X1. When this is the case, the average series on-resistance values, substrate currents, breakdown voltage, and hot carrier reliability are not substantially the same for the first and second devices.

Figure 11:
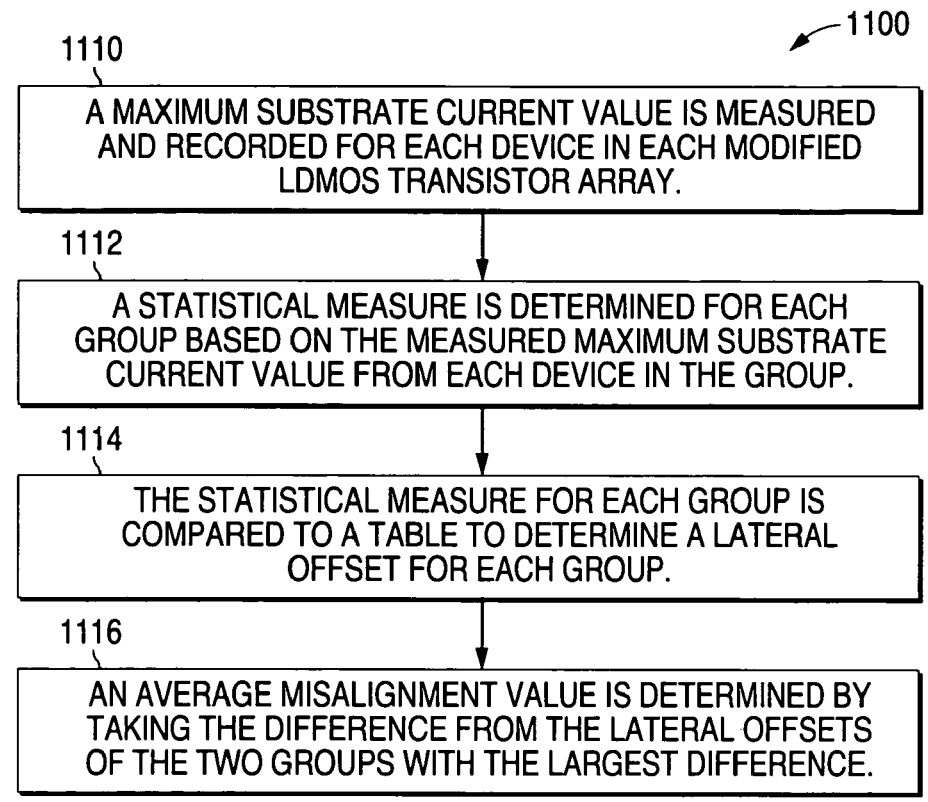
FIG. 11 is a flow chart illustrating an example of a method 1100 of determining a mask alignment error in accordance with the present invention.

FIG. 11 shows a flow chart that illustrates an example of a method 1100 of determining a mask alignment error in accordance with the present invention. In the FIG. 11 example, the substrate current is used to determine a mask alignment error. As shown in FIG. 11, at 1110, a measured maximum substrate current value is measured and recorded for each device in each modified LDMOS transistor array. For example, if 600 modified LDMOS transistor arrays 300 are formed on a wafer, the maximum substrate current values for 600 MOS devices 140 in the first group, and 600 MOS devices 142 in the second group, are measured and recorded.

Once the measured maximum substrate current values have been determined, at 1112, a statistical measure is determined for each group based on the measured maximum substrate current value from each device in the group. For example, an average or mean measured maximum substrate current value can be determined for the devices in the first group, such as the 600 MOS devices 140.

In addition, an average or mean measured maximum substrate current value can be determined for the devices in the second group, such as the 600 MOS devices 142. Similarly, the average or mean measured maximum substrate current value can be determined for the devices in any additional groups when more than two devices are present in an array. (Standard deviations and other measures can also be determined.) Using the FIG. 6 example, the groups of first MOS devices 140 have an average of 4.2 µA/µM, while the groups of second MOS devices 142 have an average 5.8 µA/µM.

Referring again to FIG. 11, at 1114, the statistical measure for each group is compared to a table to determine a lateral offset for each group. For example, if the MOS devices 140 in the first group have an average measured maximum substrate current value of 4.2 µA/µM, a corresponding lateral offset value of −0.29 µM can be read from the table. In addition, if the MOS devices 142 in the second group have an average measured maximum substrate current value of 5.8 µA/µM, a corresponding lateral offset value of −0.18 µM can be read from the table.

Figure 12:
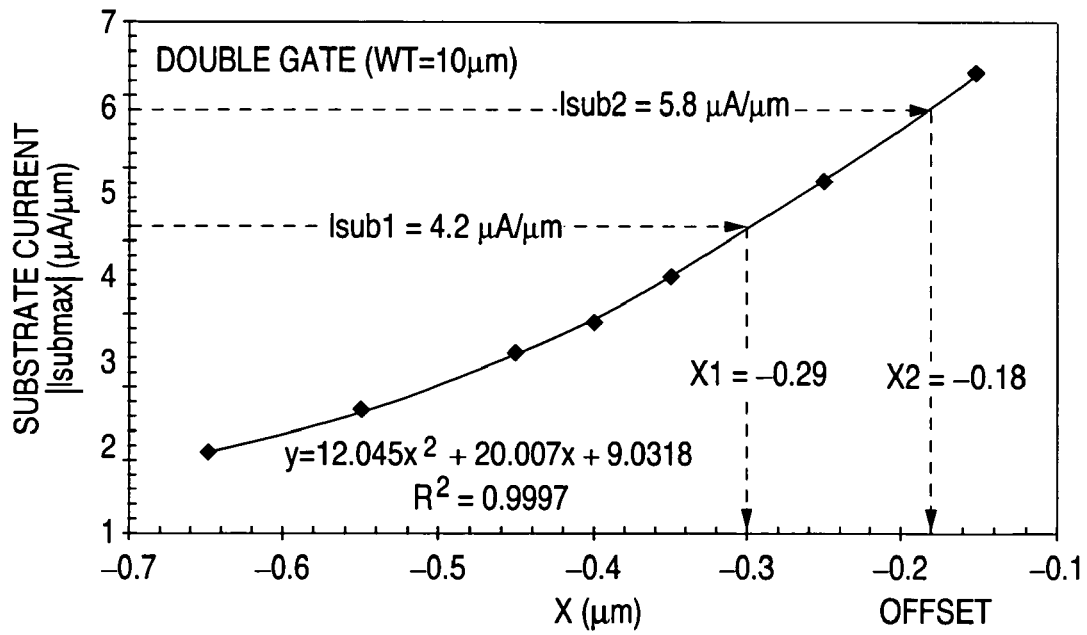
FIG. 12 is a graph illustrating an example of the average measured substrate currents and corresponding offset values in accordance with the present invention.

FIG. 12 shows a graph that illustrates an example of the average measured substrate currents and corresponding offset values in accordance with the present invention. The graph, which can be experimentally determined with devices that have a known lateral offset, can be used as a source of entries for the table. In the FIG. 12 example, the 600 MOS devices 140 in the first group have an average measured substrate current of 4.2 µA/µM which, in turn, corresponds with an offset value of −0.29. On the other hand, the 600 MOS devices 142 in the second group have an average measured substrate current of 5.8 µA/µM which, in turn, corresponds with an offset value of −0.18.

Returning to FIG. 11, at 1116, an average misalignment value is determined by taking the difference from the lateral offsets of the two groups with the largest difference. In the dual-device example of array 300, if the MOS devices 140 in the first group have a lateral offset value of −0.29 µM, and the MOS devices 142 in the second group have a lateral offset value of −0.18 µM, an average misalignment error of 0.11 µM results. If process alignment is perfect, no difference in the offset value would be observed. Thus, a perfect process alignment produces an offset value of zero.

In addition to the average misalignment error, the worst case misalignment error can also be determined by comparing the lowest substrate current of the MOS devices in one group to the table, and the highest substrate current of the MOS devices in another group to the table.

For example, as shown in FIG. 6, the lowest substrate current of the MOS devices 140 in the first group is approximately 3.5 µA/µM which, when compared to the graph in FIG. 12, results in an offset value X of about −0.35 µM. In addition, as shown in FIG. 6, the highest substrate current of the MOS devices 142 in the second group is just less than 7.0 µA/µM which, when compared to the graph in FIG. 12, results in an offset value X of about −0.12 µM. Thus, a worst case misalignment of 0.23 µM results.

As a result, if the n− drain extension region mask is laterally adjusted using an average misalignment error of 0.11 µM and a worst case misalignment error of 0.23 µM, and then the parts are tested at the end of the fabrication line, the MOS devices 140 and 142 in the LDMOS transistor arrays sold to customers can have substantially symmetrical device operation and reliability.

In addition, the breakdown voltages and reliabilities of the devices in the modified LDMOS transistor arrays can also be used to determine a mask alignment error. Of critical concern is the effect of misalignment on the breakdown voltage of the LDMOS array. In this case the breakdown voltage of the array is reduced by the process misalignment of the first device 140 relative to the second device 142.

Figure 13:
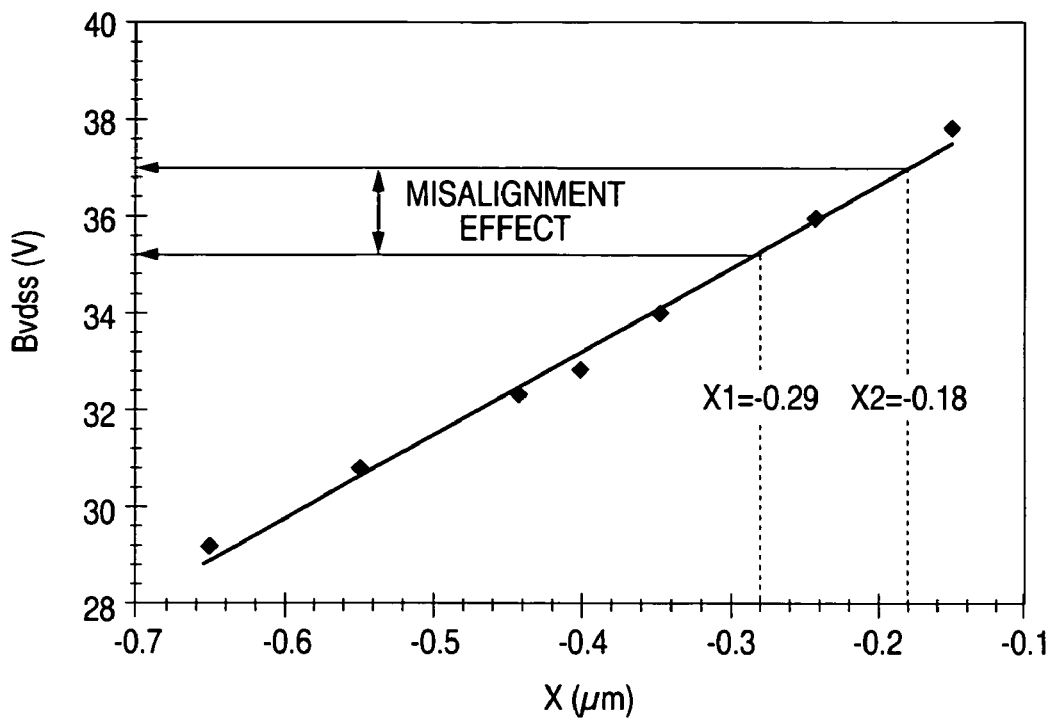
FIG. 13 is a graph illustrating an example of the average measured breakdown voltages and corresponding offset values in accordance with the present invention.

FIG. 13 shows a graph that illustrates an example of the average measured breakdown voltages and corresponding offset values in accordance with the present invention. The graph can be experimentally determined with devices that have a known lateral offset. In the FIG. 13 example, the 600 MOS devices 140 in the first group have an average measured breakdown voltage of 35.2V which, in turn, corresponds with an offset value of −0.29. On the other hand, the 600 MOS devices 142 in the second group have an average measured breakdown voltage of 37.0V which, in turn, corresponds with an offset value of −0.18.

As a result, the groups of first and second MOS devices 140 and 142 have an average difference in breakdown voltage of 1.8V, and an average difference in offset value of 0.11. If process alignment is perfect, no difference in the average breakdown voltage of the first device 140 relative to the second device 142 would be observed. Thus, a perfect process alignment produces an offset value of zero.

Figure 14:
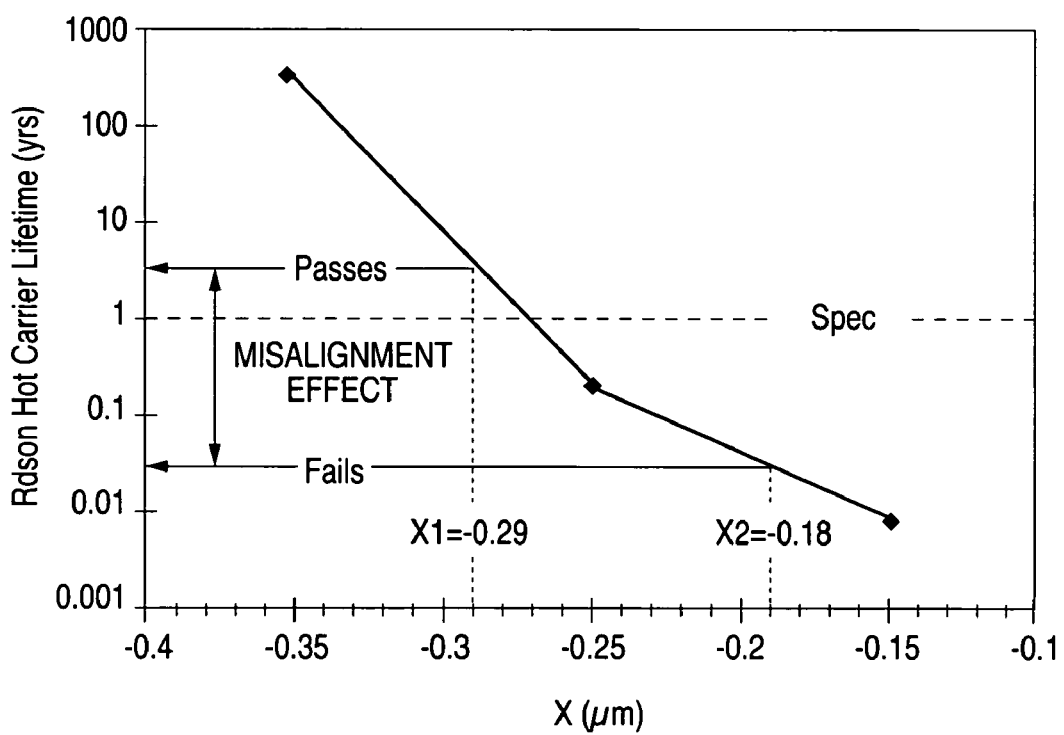
FIG. 14 is a graph illustrating an example of the average measured hot carrier on-resistance (Rdson) lifetimes and corresponding offset values in accordance with the present invention.

FIG. 14 shows a graph that illustrates an example of the average measured hot carrier on-resistance (Rdson) lifetimes and corresponding offset values in accordance with the present invention. The graph can be experimentally determined with devices that have a known lateral offset. In the FIG. 14 example, the 600 MOS devices 140 in the have an average measured hot carrier lifetime of 5.0 years which corresponds to offset value of −0.29. In addition, the 600 MOS devices 142 in the second group have an average measured hot carrier lifetime of 0.05 years which corresponds to offset value of −0.18.

As a result, the groups of first and second MOS devices 140 and 142 have nearly a 5 year difference, and an average difference in offset value of 0.11. If process alignment is perfect, no difference in the average hot carrier lifetime of the first device 140 relative to the second device 142 would be observed. Thus, a perfect process alignment produces an offset value of zero.

Thus, the present invention provides a method of monitoring the mask alignment and process biases, as well as information utilized in adjusting the alignment. When the alignment of the mask is correct, the electrical and device reliability performance of both devices are symmetric and optimal.

It should be understood that the above descriptions are examples of the present invention, and that various alternatives of the invention described herein may be employed in practicing the invention. For example, the present invention applies to all extended drain devices, regardless of whether the devices are p-type or n-type, dual-gate or multi-gate, or use composite, trench, or field oxide. Thus, it is intended that the following claims define the scope of the invention and that structures and methods within the scope of these claims and their equivalents be covered thereby.

What is claimed is:

1. A method of measuring misalignment in a plurality of transistor arrays, each transistor array of the plurality of transistor arrays having a plurality of transistors, the plurality of transistors including a first transistor and a second transistor, each first transistor having a first channel that lies between and touches a drain region and a first source region, and a first gate that lies over the first channel, each second transistor having a second channel that lies between and touches the drain region and a second source region, and a second gate that lies over the second channel, the first gate and the second gate in each transistor array being electrically isolated, the method comprising:

applying voltages to the plurality of transistors;
measuring a value for the first transistor in each transistor array to determine a plurality of first measured values such that each first transistor has a first measured value, and a value for the second transistor in each transistor array to determine a plurality of second measured values such that each second transistor has a second measured value, a first measured value being measured after voltages have been applied to the drain region, the first source region, the first channel, and the first gate of a first transistor, a second measured value being measured after voltages have been applied to the drain region, the second source region, the second channel, and the second gate of a second transistor;
determining a first statistical measure from the plurality of first measured values, and a second statistical measure from the plurality of second measured values; and
determining a difference between the first statistical measure and the second statistical measure.

2. The method of claim 1 and further comprising determining if the difference falls within a range of acceptable values.

3. The method of claim 1 wherein each first measured value and each second measured value is a series on-resistance, the first statistical measure is an average or mean measured series on-resistance value, and the second statistical measure is an average or mean measured series on-resistance value.

4. The method of claim 1 wherein each first measured value and each second measured value is a substrate current, the first statistical measure is an average or mean substrate current value, and the second statistical measure is an average or mean substrate current value.

5. The method of claim 1 wherein each first measured value and each second measured value is a breakdown voltage, the first statistical measure is an average or mean measured breakdown voltage value, and the second statistical measure is an average or mean measured breakdown voltage value.

6. The method of claim 1 wherein each first measured value and each second measured value is a hot carrier reliability, the first statistical measure is an average or mean measured hot carrier reliability value, and the second statistical measure is an average or mean measured hot carrier reliability value.

7. A method of measuring misalignment in a plurality of transistor arrays, the plurality of transistor arrays including a first transistor array and a second transistor array, each transistor array of the plurality of transistor arrays having a plurality of transistors, each transistor in the first transistor array having a corresponding transistor in the second transistor array, each transistor in a transistor array having a channel that lies between and touches a drain region and a source region, and a gate that lies over the channel, the gate of each transistor in a transistor array being electrically isolated from the gate of each other transistor in the transistor array, the method comprising:
applying voltages to the plurality of transistors;
measuring a value to determine a measured value for each transistor in each transistor array of the plurality of transistor arrays, the measured value for a transistor being measured after voltages have been applied to the drain region, the source region, the channel, and the gate of the transistor;
determining a plurality of statistical measures, each statistical measure being determined from a different plurality of measured values, each different plurality of measured values including a measured value for a transistor in the first transistor array and a measured value for the corresponding transistor in the second transistor array; and
determining a difference between a largest statistical measure and a smallest statistical measure of the plurality of statistical measures.

8. The method of claim 7 and further comprising determining if the difference falls within a range of acceptable values.

9. The method of claim 7 wherein the measured value for each transistor is a series on-resistance, and each statistical measure is an average or mean measured series on-resistance value.

10. The method of claim 7 wherein the measured value for each transistor is a substrate current, and each statistical measure is an average or mean substrate current value.

11. The method of claim 7 wherein the measured value for each transistor is a breakdown voltage, and each statistical measure is an average or mean measured breakdown voltage value.

12. The method of claim 7 wherein the measured value for each transistor is a hot carrier reliability, and each statistical measure is an average or mean measured hot carrier reliability value.

13. The method of claim 1 wherein:
the first statistical measure is an average of the plurality of first measured values; and
the second statistical measure is an average of the plurality of second measured values.

14. The method of claim 1 wherein:
the first statistical measure is a look up table result determined from a first statistical result, the first statistical result being determined from the plurality of first measured values; and
the second statistical measure is a look up table result determined from a second statistical result, the second statistical result being determined from the plurality of second measured values.

15. The method of claim 14 wherein:
the first statistical result is an average of the plurality of first measured values; and
the second statistical result is an average of the plurality of second measured values.

16. The method of claim 14 and further comprising:
determining a first look up table value for a lowest measured value from the plurality of first measured values;
determining a second look up table value for a highest measured value from the plurality of second measured values; and
determining a difference between the first look up table value and the second look up table value as a worst case result.

17. The method of claim 7 wherein:
the different plurality of measured values has a corresponding plurality of mean values such that each of the different plurality of measured values has a mean value,
the largest statistical measure is a largest mean value of the corresponding plurality of mean values, and
the smallest statistical measure is a smallest mean value of the corresponding plurality of mean values.

18. The method of claim 7 wherein:
the different plurality of measured values has a corresponding plurality of statistical values such that each of the different plurality of measured values has a statistical value, the corresponding plurality of statistical values having a corresponding plurality of look up values such that each of the corresponding plurality of statistical values has a look up value,
the largest statistical measure is a largest look up value of the corresponding plurality of look up values, and the smallest statistical measure is a smallest look up value of the corresponding plurality of look up values.

19. The method of claim 18 wherein the corresponding plurality of statistical values are a plurality of mean values such that each of the different plurality of measured values has a mean value.

20. The method of claim 18 wherein:
a first plurality of measured values of the different plurality of measured values has a lowest measured value, and
a second plurality of measured values of the different plurality of measured values has a highest measured value, and further comprising:
determining a first look up table value for the lowest measured value;
determining a second look up table value for the highest measured value; and
determining a difference between the first look up table value and the second look up table value as a worst case result.

* * * * *